United States Patent [19]

Bartoli et al.

[11] 4,346,348

[45] Aug. 24, 1982

[54] LASER TECHNIQUE FOR ACCURATELY DETERMINING THE COMPENSATION DENSITY IN N-TYPE NARROW GAP SEMICONDUCTOR

[75] Inventors: Filbert J. Bartoli, Upper Marlboro; Jerry R. Meyer, Baltimore, both of Md.

[73] Assignee: The United States of America as represented by the Secretary of the Navy, Washington, D.C.

[21] Appl. No.: 125,427

[22] Filed: Feb. 28, 1980

[51] Int. Cl.³ ............... G01R 31/26; G01R 27/02
[52] U.S. Cl. ........................ 324/158 R; 324/62; 324/158 D
[58] Field of Search ............ 324/158 R, 158 D, 62

[56] References Cited

U.S. PATENT DOCUMENTS 4,217,547 8/1980 Bartoli et al. .................. 324/158 D

*Primary Examiner*—Ernest F. Karlsen
*Attorney, Agent, or Firm*—Robert F. Beers; William T. Ellis; Melvin L. Crane

[57] ABSTRACT

A method for accurately determining the compensation density of n-type narrow-gap semiconductors. A semiconductor sample is irradiated with laser pulses of a particular density and pulse width for a particular time length with the sample maintained at a low temperature to generate photo-excited carriers within the semiconductor sample. Photons of energy less than the energy gap, $E_g$, but greater than, $E_g/2$, generate carriers uniformly throughout the semiconductor via the nonlinear mechanism of two-photon absorption. Photo-Hall measurements are made on the semiconductor sample during and after the laser pulse to determine the mobility, $\mu$, and carrier density, n, as a function of time using suitable equipment such as a computer controlled digital processing oscilloscope to display the curves. The curves displayed by the oscilloscope are compared with previously calculated curves to obtain a match and thereby determine the quality of the sample. By combining measurements of the Hall effect and conductivity, one can deduce the carrier densities and mobilities as well as other various quantities by well-known formulas.

5 Claims, 4 Drawing Figures

LASER TECHNIQUE FOR ACCURATELY DETERMINING THE COMPENSATION DENSITY IN N-TYPE NARROW GAP SEMICONDUCTOR

BACKGROUND OF THE INVENTION

This invention relates to n-type narrow-gap semiconductors and more particularly to a method for more accurately determining the compensation density of such semiconductors.

Narrow-gap semiconductors such as InSb, HgCdTe, etc., have important applications in electro-optics because of their use as infrared detectors and as laser materials. In order to provide the best quality materials for such devices, it is necessary to characterize the material as to its quality and suitability for use. In order to characterize such materials, it is very important to determine the donor concentration, $N_D$, and the acceptor concentration, $N_A$. The compensation density for n-type, material is equal to the acceptor concentration.

For n-type material, the net impurity density, n, where $n = N_D - N_A$ for monovalent defects, can be determined quite easily from Hall measurements. However, there are no known reliable techniques for determining the density of compensating acceptors, $N_A$, in n-type narrow-gap materials. For wide-gap semiconductors, $N_A$ can be determined from measurements of n as a function of temperature. As the temperature decreases, thermal excitation of carriers from the donors and acceptors becomes less probable. The decrease in n with decreasing temperature is known as carrier "freezeout". The change in n with temperature permits one to determine the compensation density. However, such carrier "freezeout" does not occur for n-type narrow gap materials where the donor levels are merged with the conduction band.

A method for determining the compensation density in n-type InSb has been suggested previously. This method relies on a theoretical model to calculate the low temperature mobility for a given electron density, n, using the compensation density as a variable parameter. $N_A$ is obtained by comparing measured and calculated values of mobility. However two serious drawbacks make this approach unreliable. (1) The method is not applicable to the important class of ternary (e.g. $Hg_{1-x}Cd_xTe$) and quaternary (e.g. $[PbSe]_{1-x}[SnTe]_x$) compounds. For these mixed compounds, the mobility is extremely sensitive to the alloy composition x. Since this parameter is generally not well known, a simple comparison of the measured and calculated mobility is highly inaccurate. (2) Even for simple compounds like InSb the method is unreliable since it is based on a model which neglects important higher-order corrections to the theory. Comparison of the measured low-temperature mobility to the calculated value for a single value of n is unreliable. To be reliable, theory and experiment must be compared over a wide range of values of n. Consequently there is a need for a non-destructive technique for determining the compensation density for n-type narrow-gap semiconductors.

A previous method has been set forth in an article: "Transport Properties of Photo-Excited Carriers in Slightly Compensated $Hg_{0.785}Cd_{0.215}Te$." by F. J. Bartoli et al., *Solid State Communications*, Vol. 25, pp. 963–966, March 1978, and also has been set forth in patent application Ser. No. 011,821 filed Feb. 13, 1979. In this patent application, the method compares measured values of mobility as a function of photo-excited carrier density to theoretical curves which were calculated assuming a spatially uniform carrier distribution. However, it has been found that this method limits the accuracy to which $N_A$ can be determined because the carriers are generated in a thin layer on the surface of the sample, resulting in a non-uniform center distribution. The non-uniform carrier density results from the large linear absorption coefficient ($\alpha = 10^3$ to $10^5 \, cm^{-1}$) for photons with energies greater than the energy gap $E_g$ of the semiconductor. A single photon in this energy range has sufficient energy to excite a valence electron into the conduction band. Correction of the data for the non-uniform carrier distribution must be accomplished using approximate methods, hence introducing error in the technique.

SUMMARY OF THE INVENTION

The present invention comprises a non-destructive technique for determining the compensation density for n-type narrow-gap semiconductor materials such as InSb or $Hg_{1-x}Cd_xTe$ which are fabricated into standard Van der Pauw photo-Hall samples such as commonly used for material characterization. Carriers are optically injected into the material by laser pulses having an energy of less than the energy gap, $E_g$, but greater than, $E_g/2$, and the photo-Hall mobility is measured as a function of photoexcited carrier density. For example a TEA or Q-switched laser may be used as an excitation source to generate sufficiently high density of carriers that the functional dependence of the photo-Hall mobility, $\mu$, on n may be determined for a wide range of n. It has been determined that the functional dependence of $\mu$ on n is very sensitive to the compensation density.

DETAILED DESCRIPTION

In carrying out this invention, samples of a semi-conductor material to be tested are fabricated into Van der Pauw photo-Hall samples to obtain a mobility vs carrier density curve which is used as a basis for comparing curves of the tested material with compensation density curves previously calculated for materials with different compensation densities to determined the useful quality of the sample. The sample is cooled to a sufficiently low temperature, from 2°–40° K., that the mobility is limited by scattering of the electrons by ionized impurities.

Figure 1:
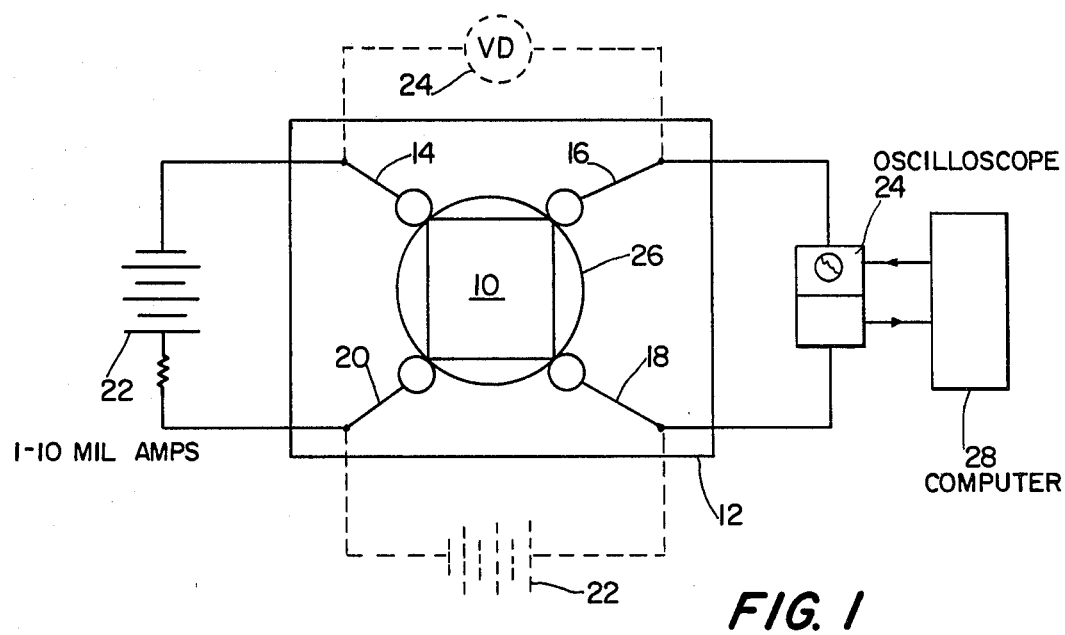
FIG. 1 illustrates a semiconductor material setup by which compensation density is measured (different connections shown in phantom).

FIG. 1 illustrates a HgCdTe sample 10 prepared and arranged for determining a conductivity-voltage curve. Samples to be tested may be of any size and thickness except that best results are obtained when the thickness is no greater than 100 $\mu$m with measurements of from 0.1 mm to 2.0 mm along the sides. It is important that the thickness be limited to a thickness such that the laser radiation will penetrate the sample; however, it should be thick enough so that the Hall measurements are not dominated by surface effects. The sample is secured to a larger substrate 12 so that the substrate can be used to support the electrical contacts 14, 16, 18 and 20, as well as the samples. The electrical contacts are made at the corners of the sample.

A TEA or Q-switch $CO_2$ laser, for example, operating at a wavelength of 10.6 $\mu$m with a pulse duration of about 200 nsec may be used for InSb $Hg_{1-x}Cd_xTe$ for some x values. The laser pulse is uniformly directed upon the total surface of the sample, as shown by the circle 26, to generate a uniform carrier density in the sample. The incident radiation is such that the photon energy, h$\nu$, is less than the energy gap $E_g$ of the sample but greater than $E_g/2$. Such a photon energy generates carrier uniformly throughout the semiconductor via the nonlinear mechanism of two-photon absorption. The laser power density is kept sufficiently low so that sample heating is negligible. The laser power density should be in the range of about $10^4$–$10^7$ w/cm$^2$, depending on the material. During incidence of the laser radiation, photo-excited carriers are injected into the sample. Since the photon energy, h$\nu$, of the laser radiation is less than $E_g$ but greater than $E_g/2$, two photons are absorbed simultaneously to create an electron-hole pair. The process is nonlinear in that the amount of energy absorbed by the material is proportional to the square of the laser intensity, rather than varying linearly as for single-photon absorption. The absorption depth chosen is large compared to the sampled thickness, in order to insure a uniform carrier density of photo-excited carriers. The conductivity of the sample changes as the carriers recombine to return to their original value. To eliminate transient effects, only data taken at least 200 nsec after the peak of the laser pulse is measured and recorded. This portion of the photo-excited electron decay yields steady-state values for mobility as a function of electron density as discussed below.

In carrying out the measurements, a steady DC electrical source is connected across the contacts 14 and 20 (see FIG. 1) fixed to two adjacent corners of the sample to supply a steady current I of from 1–10 milliamps, and a voltage detector 24 is connected across the contacts 16 and 18 affixed to the other two corners of the sample to detect the voltage output. The measured voltage output changes as the conductivity of sample changes due the incidence of the laser radiation. The voltage detector may be an oscilloscope which measures and displays a trace of the voltage output which can be recorded by taking a photograph of the displayed output voltage trace. The voltage output may also be stored in a computer 28 for later retrieval and display on the oscilloscope.

After photo-excited carriers have recombined and the voltage trace has been completed for the first test position, the polarity of the voltage source is changed and a second voltage trace is made for a second laser pulse identical to the first laser pulse. After the second voltage trace has been completed, the voltage sources is connected across contacts 18 and 20 so that the applied voltage is perpendicular to the previously applied voltage and the voltage detector is connected across contacts 14 and 16. The same procedures are followed as described above to obtain voltage traces for each polarity in the latter arrangement. Voltage traces may also be obtained for the other contacts in the same manner. This gives four or eight voltage traces for the same parameters. The voltage values for each corresponding laser pulse may be averaged by hand, using ohm's law and the conductivity formula or averaged by the computer and displayed on the oscilloscope to present a single average conductivity-voltage curve. Alternatively the averaged voltage vs. time curve can be obtained from hand calculations on photographed oscilloscope traces of the voltage outputs by use of well known averaging formulas.

Figure 2:
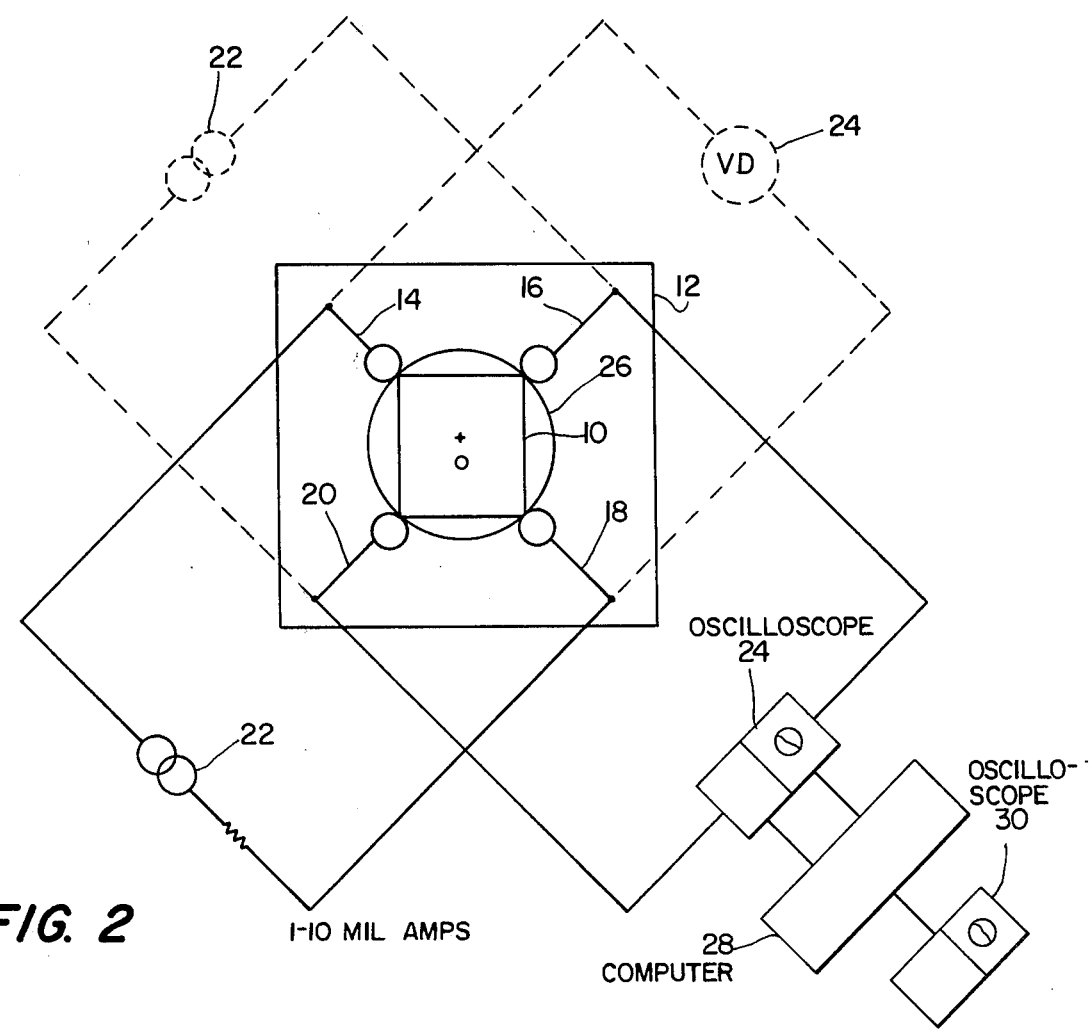
FIG. 2 illustrates a Van der Pauw sample by which Hall-voltages are obtained (with different connections shown in phantom).

After the average conductivity-voltage curve has been determined, the same sample is tested for Hall-voltages. As shown in FIG. 2, Hall voltages are obtained in the same manner as above except that the voltage source is applied across opposite corners such as 14 and 18, and the voltage detector is connected across opposite corners 16 and 20. Additionally, a magnetic field is applied perpendicularly to the surface plane of the sample and the sample is cooled to from 2°–40° K. as before. With the magnetic field in one direction, a Hall-voltage curve is made for each polarity of the applied voltage. Then the direction of the magnetic field is reversed and additional Hall-voltage curves are obtained for each polarity of the applied voltage. The voltage source and detector connections are then switched and more Hall-voltage curves are obtained for each polarity of the electrical source and for each direction of the magnetic field as set forth above. Hall-voltage curves may be obtained for each pair of opposite corner contacts and with the magnetic field in each direction to obtain either 8 or 16 curves as desired. The voltage values for corresponding times are averaged and an average Hall-voltage vs time curve is obtained.

Figure 3:
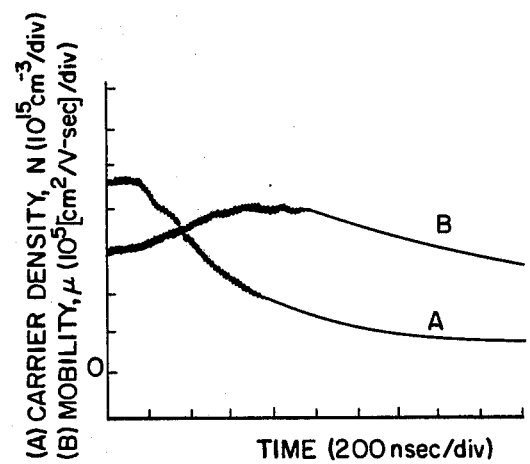
FIG. 3 illustrates curves depicting the relative relationship between photo-Hall mobility and electron density.

After the average conductivity-voltage and average Hall-voltage vs time curves have been obtained, these values are used to obtain carrier mobility, $\mu$, and carrier density, n. This can be accomplished using the appropriate formulas (described in Philips Research Reports, Vol. 13, pages 1–9, February 1958) either by hand or automatically by the use of a digital computer 28 connected to the voltage detectors and programmed to convert the average conductivity- and Hall-voltages directly to carrier density and mobility. For the sample configuration described in FIGS. 1 and 2, the sample conductivity $\sigma$ as a function of time may be obtained from the conductivity-voltage curve $V_c(t)$ by means of the expression $$\sigma(t) = \frac{I \ln(2)}{d V_c(t)}$$

where I is the current, d is the sample thickness and ln(2) is the natural log of 2. The carrier density as a function of time may then be obtained from the Hall-voltage curve $V_H(t)$ by the expression $$n = \frac{B(10^{-8})I}{e d V_H(t)}$$

where B is the magnetic field and e the charge of an electron. Finally the mobility $\mu$ is equal to $\sigma/ne$. The photo-Hall mobility, $\mu$, and electron density, n, may be monitored on a digital processing oscilloscope 24 such as a Tektronix R7912 Waveform digitizer interfaced to a mini-computer 28 such as a PDP-11/40. FIG. 3 shows sample cathode ray tube traces of the carrier density, n, (curve A) and mobility, $\mu$, (curve B) as a function of time beginning with the peak of a 200 nsec laser pulse. After reaching their maximum values, both n and $\mu$ decay monotonically to their dark values. The mobility peaks approximately 700 nsec after n indicating that $\mu$ passes through a maximum as a function of n. As shown in FIG. 3, the horizontal scale is 200 nsec per division; the vertical scales are as follows: Curve A is $1 \times 10^{15}$ cm$^{-3}$ per division and Curve B is $1 \times 10^5$ cm$^2$/V-sec per division. The zero level for $\mu$ and n is indicated on the vertical scale. If a computer is not used, then the curves as shown would have to be determined by hand by use of the conversion formulas.

Figure 4:
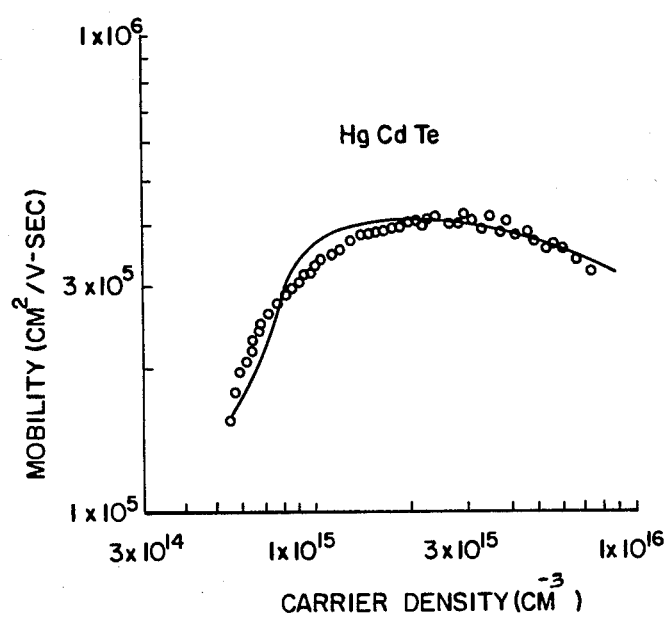
FIG. 4 illustrates experimental and theoretical curves of mobility as a function of electron density.

The solid line in FIG. 4 illustrates a theoretical curve for mobility $\mu$, as a function of carrier density, n, for the sample set forth above. The decrease in mobility for large carrier density is attributed to electron-hole scattering. The mobility enhancement at lower electron densities are explained in terms of neutralization of charged compensating acceptors. Photo-excited holes are captured by ionized acceptors because of the Coulomb attraction (each ionized monovalent acceptor can capture 1 hole). Hole capture neutralizes the acceptors which then cannot scatter electrons as effectively. Consequently, this tends to increase the mobility. Furthermore, the photo-excited electrons increase the screening of the scattering potential and also tend to increase $\mu$. Any photo-excited holes not captured by an ionized acceptor give rise to electron-hole scattering which tends to reduce the mobility. For sufficiently high photoexcited carrier densities (i.e., $>>N_A$), most of the photoexcited holes are free and the mobility will decrease due to electron-hole scattering.

The mobility depends strongly on the compensation density $N_A$ through the following relations $\mu=n/N$ ABM where $n=N_D-rN_A+n_e$ and $$N_{cc} = N_D + \sum_{z=1}^{r} z^2 N_A^{(-z)cc} + P_e$$

where $N_A^{(-z)}$ denotes the density of acceptors with a charge of $-z$, and $N_{cc}$ is the density of charged scattering centers. In these relations r is the valence of the acceptors and $n_e$ and $p_e$ are the excess electron and hole densities. The factor, A, represents the normal expression for scattering by single sites in the Born approximation and is described in Zawadski, W. and Szymanska, W., *Phys. Status Solidi*, (b) 45, 415 (1971). B is a phase-shift correction for the Born approximation described by J. B. Kriger and S. Strauss, *Phys Rev.*, Vol. 169, No. 3, p. 674–679, May 15, 1968); and M is a correction for multiple-ion-scattering (described in E. F. Moore and H. Ehrenreich, *Solid State Communications*, Vol. 4, p. 407, 1966).

A family of $\mu$vs n curves is calculated for different values of $N_{cc}$ by varying $N_{CC}$ and keeping $\mu$ and n equal to the measured values for the narrow gap semiconductor sample in the absence of optical excitation to obtain curves representing $N_{A1}$, $N_{A2}$, etc. By comparing the measured $\mu$vs n curve to the calculated family of curves, the compensation density $N_A$ can be obtained directly by matching the measured curve with one of the $\mu$vs n curves of the family of curves previously calculated.

The laser power density and pulse width may be varied to optimize the above method for different narrow-gap semiconductors. Different optical sources such as CO, HF and DF lasers may be used. The technique may be used for lattice defects as well as substitutional impurities and can be used for defects of arbitrary valency.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A nondestructive optical technique for determining the compensation density of narrow-gap semiconductors which comprises the steps of:
   fabricating a sample of n-type, narrow-gap semiconductive material on an electrically nonconductive substrate to include electrical contacts at the corners of the semiconductor material;
   cooling said semiconductor sample;
   directing uniformly over the surface area of said semiconductor sample a laser pulse of such a wavelength that the photon energy is less than the band gap of the sample but greater than $\frac{1}{2}$ of the band gap with a power density such that carries are generated uniformly throughout the volume of the sample;
   applying a steady D.C. voltage to adjacent contacts on said sample;
   measuring and recording the conductivity voltage for a given combination of electrical contacts of said sample;
   repeating the above conductivity voltage measurements for each combination of electrical contacts and voltage source polarity and obtaining an average conductivity voltage curve for all data obtained;
   directing a magnetic field perpendicularly to the surface area of said sample;
   directing uniformly over the surface area of said semiconductor sample a laser pulse of such a wavelength that the photon energy is less than the band gap of the sample but greater than $\frac{1}{2}$ the band gap with a power density such that carriers are generated uniformly throughout the volume of said sample;
   measuring and recording the Hall-voltages after peak of the laser pulse for each pair of electrical contacts with the magnetic field in each direction perpendicular to the surface area and for each polarity of said source;
   obtaining an average Hall-voltage curve from all recorded Hall-voltage curves;
   from the average Hall-voltage curve and average conductivity voltage curve obtained, preparing a mobility vs carrier density curve; and
   comparing the obtained mobility vs carrier density curve with a family of previously calculated curves representing different compensation densities, thereby determining the compensation density by obtaining a match, and hence designating the quality of the material of the sample.

2. A nondestructive technique as claimed in claim 1 in which:
   the power density of said laser pulse in low enough to prevent sample heating.

3. A nondestructive technique as claimed in claim 2 in which:
   said sample is cooled to a temperature of from about 2° K. to about 40° K.

4. A nondestructive technique as claimed in claim 1 in which:
said laser has an output pulse of 10.6 μm with a duration of at least 200 nsec with a power density between $10^4$ and $10^7$ Wcm$^{-2}$.

5. A nondestructive technique as claimed in claim 3 in which:
said laser has an output pulse of 10.6 μm with a duration of about 200 nsec with a power density between $10^4$ and $10^7$ Wcm$^{-2}$.

* * * * *